(12) United States Patent
Bishop et al.

(10) Patent No.: US 6,930,400 B1
(45) Date of Patent: Aug. 16, 2005

(54) GRID ARRAY MICROELECTRONIC PACKAGES WITH INCREASED PERIPHERY

(75) Inventors: Robert H. Bishop, Suwanee, GA (US); David J. Klein, Duluth, GA (US)

(73) Assignee: Integrated Device Technology, Inc., Santa Clara, CA (US)

( * ) Notice: Subject to any disclaimer, the term of this patent is extended or adjusted under 35 U.S.C. 154(b) by 0 days.

(21) Appl. No.: 10/689,946

(22) Filed: Oct. 21, 2003

(51) Int. Cl.[7] .................. H01L 23/48; H01L 23/52; H01L 29/40
(52) U.S. Cl. .............. 257/786; 257/773; 257/737; 257/738; 257/780; 257/692
(58) Field of Search ..................... 257/786, 773, 257/737, 692, 780, 738, 778

(56) References Cited

U.S. PATENT DOCUMENTS

| | | | |
|---|---|---|---|
| 4,852,016 A | | 7/1989 | McGehee |
| 5,269,453 A | * | 12/1993 | Melton et al. ......... 228/180.22 |
| 5,773,882 A | * | 6/1998 | Iwasaki ...................... 257/692 |
| 5,796,169 A | * | 8/1998 | Dockerty et al. ........... 257/780 |
| 5,814,890 A | * | 9/1998 | Iwasaki ...................... 257/778 |
| 5,859,474 A | | 1/1999 | Dordi |
| 6,001,661 A | | 12/1999 | McBean, Sr. |
| 6,677,677 B2 | * | 1/2004 | Kimura et al. .............. 257/737 |

OTHER PUBLICATIONS

Rörgren, *Chapter E: Ball Grid Array Technology*, The Nordic Electronics Packaging Guideline, 2000, 5 pp.
Horiuchi et al., *Escape Routing Design to Reduce the Number of Layers in Area Array Packaging*, IEEE Transactions on Advanced Packing, vol. 23, No. 4, Nov. 2000, pp. 686-691.
Betz et al., *Effect of the Prefabricated Routing Track Distribution of FPGA Area-Efficiency*, IEEE Transactions on Very Large Scale Integration (VLSI) Systems, vol. 6, No. 3, Sep. 1998, pp. 445-456.
Wakabayashi et al., *An Optimal Pin Assignment Algorithm With Improvement of Cell Placement in Standard Cell Layout*, Proceedings of IEEE Asia Pacific Conference on Circuits and Systems '96, Nov. 18-21, 1996, pp. 381-384.
Greenberg et al., *Single-Layer Channel Routing and Placement with Single-Sided Nets*, Computers Math. Applic., vol. 32, No. 4, 1997, pp. 1-7.
Chen et al., *A Pin Permutation Algorithm for Improving Over-the-Cell Channel Routing*, IEEE Transactions on Computer-Aided Design of Integrated Circuits and Systems, vol. 14, No. 8, Aug. 1995, pp. 1030-1037.
Li et al., *Global Routing for Gate Array*, IEEE Transactions on Computer-Aided Design, vol. CAD-3, No. 4, Oct. 1984, pp. 298-307.

\* cited by examiner

Primary Examiner—Nitin Parekh
(74) Attorney, Agent, or Firm—Myers Bigel Sibley & Sajovec PA

(57) ABSTRACT

A grid array microelectronic package includes a substrate and an array of external connectors on the substrate that are arranged in rows and columns to define a periphery of the array and the interior of the array. A routing channel is provided in the array that increases the periphery of the array by at least four external connectors, compared to absence of the routing channel. The routing channel may be made of two missing external connectors, at least two strapped external connectors and/or at least two "no-connect" external connectors in the array that extend from the periphery of the array towards the interior of the array. Signal conductors may extend along the routing channel.

15 Claims, 3 Drawing Sheets

FIG. 5

GRID ARRAY MICROELECTRONIC PACKAGES WITH INCREASED PERIPHERY

FIELD OF THE INVENTION

This invention relates to microelectronic devices and more particularly to microelectronic packages.

BACKGROUND OF THE INVENTION

Microelectronic devices are widely used in many consumer and commercial applications. As the integration density of microelectronic devices continues to increase, it may be desirable to provide more external connectors for the microelectronic devices, to accommodate larger numbers of power supply, ground and/or input/output (I/O) signal connections.

In order to increase the number of external connectors that are available for a microelectronic device, it is known to provide a grid array microelectronic package that includes a substrate and an area array of external connectors on the substrate. As used herein, an area array of external connectors includes at least four rows and at least four columns of external connectors including a pair of peripheral rows and a pair of peripheral columns at a periphery thereof and at least one pair of interior rows and at least one pair of interior columns between the respective pair of peripheral rows and peripheral columns. By arranging external connectors over an area array rather than only at the periphery of the substrate, larger numbers of external connectors may be accommodated.

As is well known to those having skill in the art, the external connectors can include pads, pins, balls such as solder balls and/or bumps such as solder bumps, and the substrate can include an integrated circuit, a ceramic substrate, a plastic substrate, and/or a printed circuit board. Grid arrays are also referred to in the art as Ball Grid Arrays (BGA), Controlled Collapse Chip Connection (C4), flip chip, and or other designations. An overview of BGA technology may be found in *Chapter E: Ball Grid Array Technology* by Rörgren, of the textbook entitled "The Nordic Electronics Packaging Guideline", 2000.

As was described above, grid array microelectronic packages can provide larger numbers of external connections for a microelectronic package. Unfortunately, however, the larger number of external connections may make it more difficult to route signal conductors, such as power supply, ground and/or I/O signal conductors, from a substrate such as an integrated circuit, ceramic substrate, plastic substrate, and/or printed circuit board to the external connectors such as pads, pins, balls, and/or bumps. As such, it is known to provide complex routing algorithms that may be used to design the routing for a grid array microelectronic package. See, for example, *Global Routing for Gate Array* by Li et al., IEEE Transactions on Computer Aided Design, Vol. CAD-3, No. 4, October 1984, pages 298–307 and *Escape Routing Design to Reduce the Number of Layers in Area Array Packaging* to Horiuchi, et al., IEEE Transactions on Advanced Packing, Vol. 23, No. 4, November 2000, pages 686–691.

U.S. Pat. No. 5,859,474 to Dordi describes a reflow ball grid array assembly wherein a first array of elongate pads is formed on a first surface, such as that of an integrated circuit substrate, and a second array of elongate pads is formed on a second surface, such as that of a printed circuit board. An array of solder balls are reflow attached to the pads of the first array and then to the pads of the second array, to thereby electrically connect the substrate to the printed circuit board. The reflow solder balls thereby conform to the elongate shapes of the pads to be configured like truncated ellipsoids. Due to the surface tension forces between the pads and the balls therebetween, the "ellipsoids" advantageously have a high standoff. Also, the pads on each of the sides of the perimeter of the array are aligned longitudinally perpendicular to the respective sides. Thereby, wide channels between adjacent elongate pads are defined, through which one or more additional traces can advantageously be routed on the surface between the pads. See the Abstract of U.S. Pat. No. 5,859,474.

SUMMARY OF THE INVENTION

Some embodiments of the present invention configure a plurality of connectors in a grid array to increase the periphery of the grid array. More specifically, according to some embodiments of the present invention, a grid array microelectronic package includes a substrate and an array of external connectors on the substrate that are arranged in rows and columns to define a periphery of the array and the interior of the array. A routing channel is provided in the array that increases the periphery of the array by at least four external connectors, compared to absence of the routing channel. In some embodiments, the routing channel comprises at least two missing external connectors in the array. Signal conductors may extend along the routing channel.

In some embodiments of the invention, the array of external connectors comprises an array of pads, pins, balls, and/or bumps, and the substrate comprises an integrated circuit, a ceramic substrate, a plastic substrate, and/or a printed circuit board. In yet other embodiments, the substrate is a first substrate and the array of external connectors is a first array of external connectors. These embodiments can provide a second substrate and a second array of external connectors on the second substrate that are arranged to mate with the first array of external connectors. The second array of external connectors and the second substrate may be the same as or different from the first array of external connectors and the first substrate. In some embodiments, the first substrate is an integrated circuit and the second substrate is a printed circuit board.

Other embodiments of the present invention provide a grid array microelectronic package that includes a substrate and an array of external connectors on the substrate that are arranged in at least four rows and at least four columns, including a pair of peripheral rows and a pair of peripheral columns at a periphery thereof and at least one pair of interior rows and at least one pair of interior columns between the respective pair of peripheral rows and peripheral columns. At least one external connector in a peripheral row or peripheral column and at least one external connector in an interior row or interior column adjacent thereto are missing from the array, to define a routing channel that extends from the periphery of the array towards the interior of the array. In some embodiments, a first external connector in a peripheral row or peripheral column, a second external connector in a first interior row or first interior column adjacent the peripheral row or peripheral column, and a third external connector in a third interior row or third interior row adjacent the first interior row or column and remote from the peripheral row or column, is missing from the array, to define the routing channel that extends from the periphery of the array towards the interior of the array.

Yet other embodiments of the present invention provide a grid array microelectronic package wherein at least one external connector in a peripheral row or peripheral column and at least one external connector in an interior row or interior column adjacent thereto are electrically strapped together, to define a routing channel that extends from the periphery of the array towards the interior of the array. In still other embodiments, at least one external connector in a peripheral row or peripheral column and at least one external connector in an interior row or interior column adjacent thereto is operationally disconnected from the substrate to define a routing channel that extends from the periphery of the array towards the interior of the array. External connectors and substrates may be provided as was described above and a second substrate and a second array of external connectors may be provided as was described above.

BRIEF DESCRIPTION OF THE DRAWINGS

FIGS. 4 and 5 are plan views of grid array microelectronic packages according to still other embodiments of the present invention.

DETAILED DESCRIPTION

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that when an element such as a layer, region or substrate is referred to as being "on" another element, it can be directly on the other element or intervening elements may also be present. It also will be understood that when an element is referred to as being "connected", "coupled" or "responsive" to another element, it can be directly connected, coupled or responsive to the other element or intervening elements may be present. In contrast, when an element is referred to as being "directly on", "directly connected", "directly coupled" or "directly responsive" to another element, there are no intervening elements present.

Figure 1A:
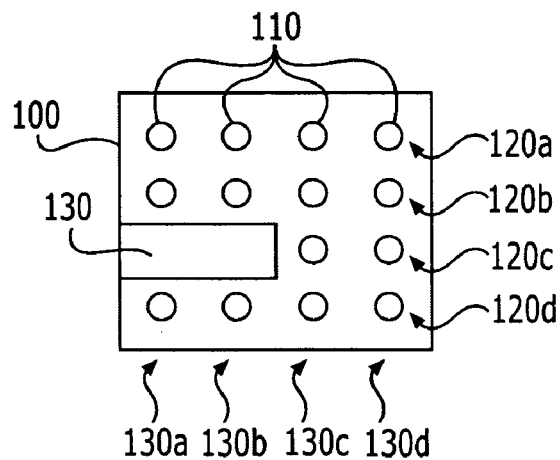
FIGS. 1A–1C are plan views of grid array microelectronic packages according to various embodiments of the present invention.
Figure 1B:
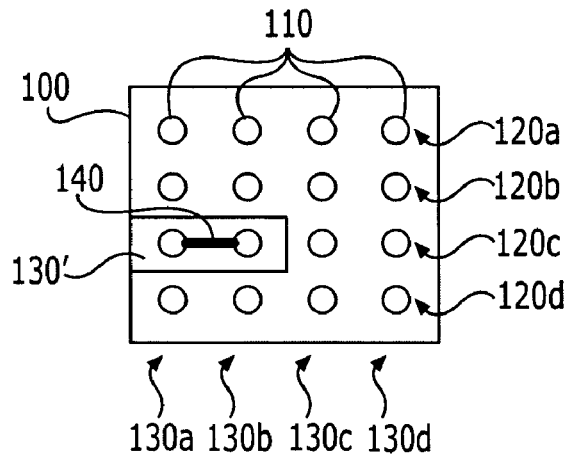
Figure 1C:
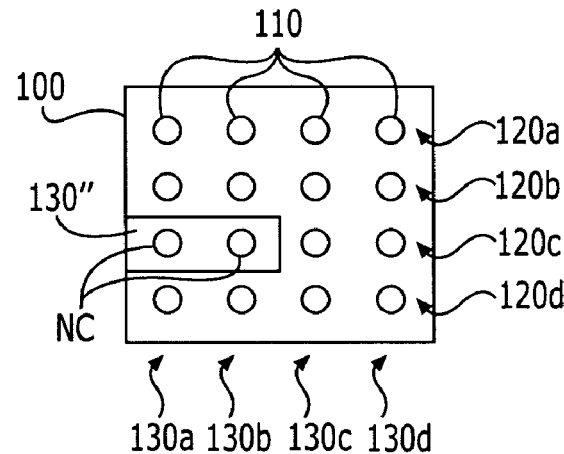

FIGS. 1A–1C are plan views of grid array microelectronic packages according to various embodiments of the present invention. As shown in FIGS. 1A–1C, grid array microelectronic packages according to various embodiments of the present invention include a substrate 100 and an array of external connectors 110 on the substrate 100 that are arranged in at least four rows 120a–120d and at least four columns 130a–130d. It will be understood that as used herein the terms "row" and "column" are used to denote two different directions, which need not be orthogonal, and do not denote a particular orientation on the substrate. Moreover, unequal numbers of rows and columns may be provided and more than four rows and/or columns may be provided as will be described below.

Continuing with the description of FIG. 1A, the rows include a pair of peripheral rows 120a and 120d and the columns include a pair of peripheral columns 130a and 130d at the periphery of the array of external connectors 110. The array of connectors 110 also includes at least one pair of interior rows 120b, 120c and at least one pair of interior columns 130b, 130c between the respective pair of peripheral rows 120a, 120d and peripheral columns 130a, 130d.

Finally, as shown in FIG. 1A, at least one external connector in a peripheral row or column, such as peripheral column 130a, and at least one external connector in an interior row or interior column adjacent thereto, such as interior column 130b, are missing from the array of external connectors 110. The missing external connectors define a routing channel 130 that extends from the periphery of the array towards the interior of the array.

In other embodiments, as shown in FIG. 1B, at least one external connector in a peripheral row or peripheral column, such as peripheral column 130a, and at least one external connector in an interior row or interior column adjacent thereto, such as interior column 130b, are electrically strapped together, for example by conductive strap 140, to define a routing channel 130' that extends from the periphery of the array towards the interior of the array. The strap 140 may be internal to the substrate 100, on the substrate 100 and/or on or in another substrate to which the substrate 100 is connected.

In yet other embodiments, as shown in FIG. 1C, at least one external connector in a peripheral row or peripheral column, such as column 130a, and at least one connector in an interior row or interior column adjacent thereto, such as column 130b, are operationally disconnected from the substrate by providing these external connectors as conventional no-connect (NC) external connectors. The NC external connectors define a routing channel 130" that extends from the periphery of the array towards the interior of the array.

Figure 2:
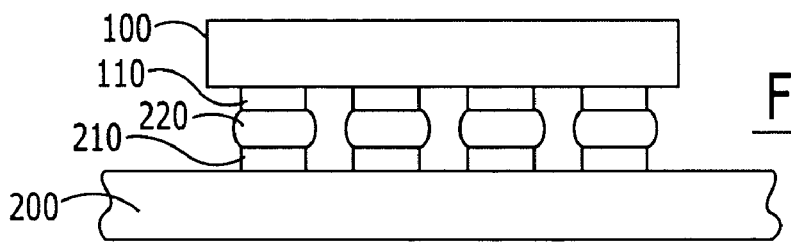
FIG. 2 is a cross-sectional view of grid array microelectronic packages of FIGS. 1A–1C.

FIG. 2 is a cross-sectional view of grid array microelectronic packages of FIGS. 1A–1C according to some embodiments of the present invention. As shown in FIG. 2, the substrate 100 can comprise an integrated circuit, a ceramic substrate, a plastic substrate, and/or a printed circuit board and the array of external connectors 110 can comprise an array of pads, pins, balls such as solder balls, and/or bumps such as solder bumps. As also shown in FIG. 2, the substrate 100 can be a first substrate and the array of external connectors 110 can be a first array of external connectors. In these embodiments, the package can further comprise a second substrate 200 and a second array of external connectors 210 on the second substrate 200 that are arranged to mate with the first array of external connectors 110 including the routing channel 130–130". In FIG. 2, mating is provided by solder bumps 220. However, other conventional connection techniques may be used to directly or indirectly connect the first array of external connectors 110 to the second array of external connectors 210. In some embodiments of the present invention, the first substrate 100 is an integrated circuit and the second substrate 200 is a printed circuit board or other second level package for the integrated circuit.

Figure 3:
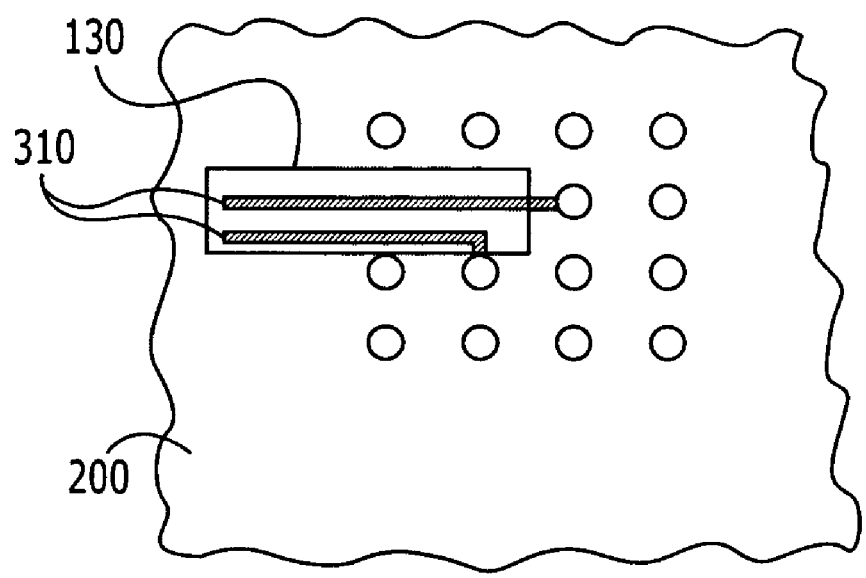
FIG. 3 is a plan view of grid array microelectronic packages according to yet other embodiments of the present invention.

FIG. 3 is a plan view of grid array microelectronic packages according to other embodiments of the present invention. As shown in FIG. 3, the first substrate 100 and/or second substrate 200 includes a routing channel 130–130" therein. As shown in FIG. 3, the routing channel may include a plurality of signal conductors 310 that extend therein. Accordingly, by configuring a routing channel according to embodiments of the present invention; additional access to the interior of the grid array may be provided for routing.

Figure 4:
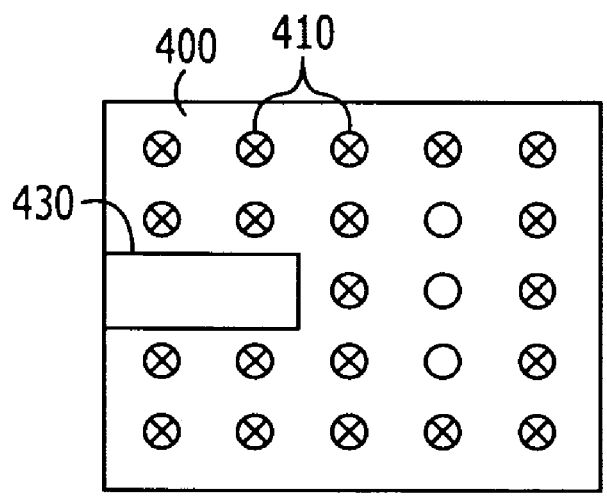

FIG. 4 is a plan view of grid array microelectronic packages according to other embodiments of the present invention. Embodiments of FIG. 4 may correspond to embodiments of FIG. 1A with a 5×5 array rather than a 4×4 array being shown. FIG. 4 illustrates embodiments of the present invention wherein a routing channel 430, which comprises missing external connectors in the array of connectors 410 on a substrate 400, increases the periphery of the array by at least four external connectors. Thus, as shown in FIG. 4, absent the routing channel 430, the periphery of the grid array would include 16 connectors 410. However, due to the presence of the routing channel 430 according to some embodiments of the present invention, the periphery includes 20 external connectors as indicated by the Xs in FIG. 4. Quantitatively, if the grid array includes N rows and M columns, some embodiments of the invention can provide a minimum number Cp of peripheral connectors of:

$Cp>2N+2(M-2)+4=2N+2M$.

Figure 5:
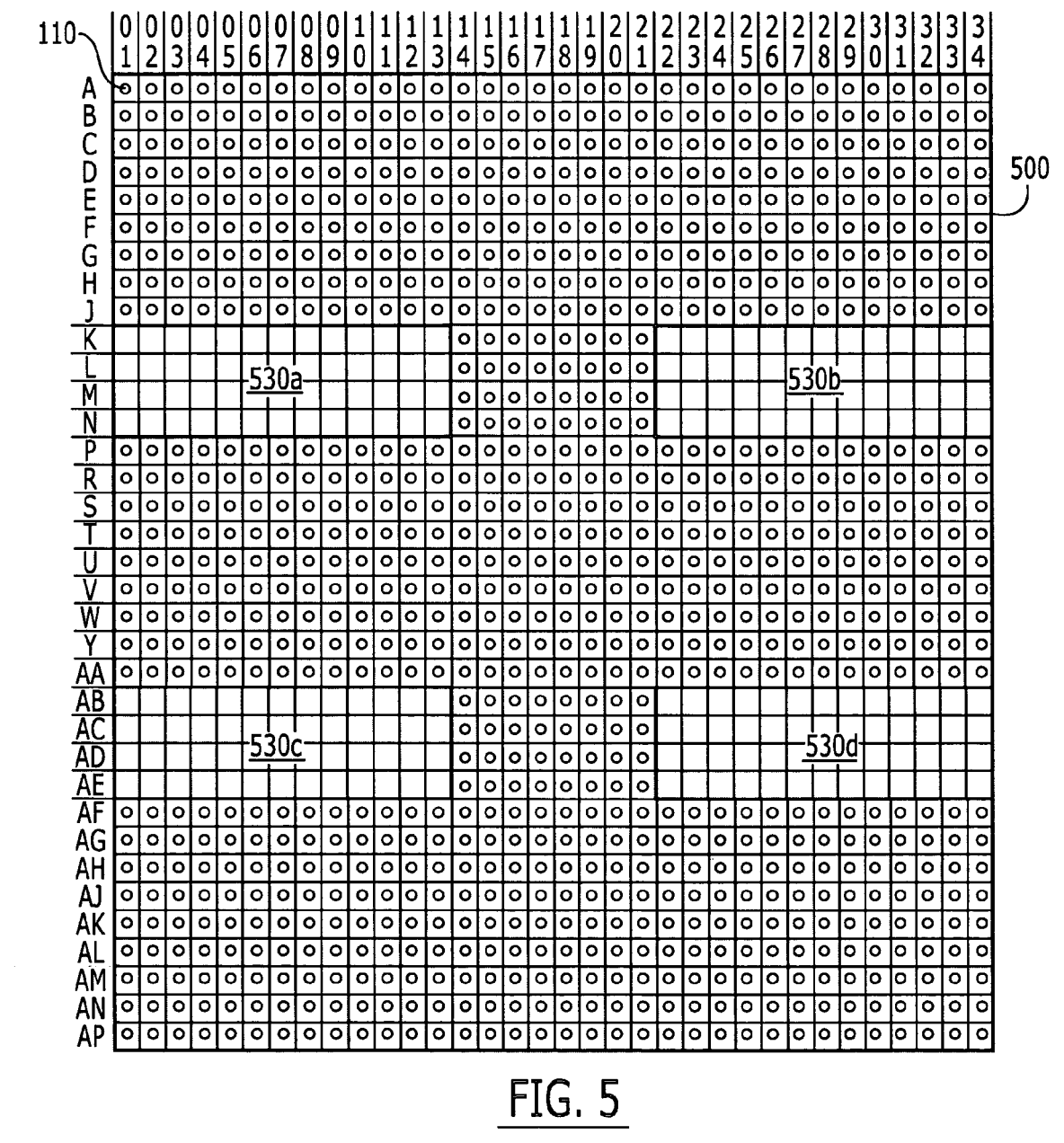

FIG. 5 is a plan view of other embodiments of the present invention wherein a substrate 500 includes therein an array of 34 rows A-AP and 34 columns 01–34 of external connectors 110. Four routing channels 530a–530d with missing external connectors are shown.

Some embodiments of the present invention may stem from a recognition that in microelectronic packages that have their electrical connections in a grid array, the external connectors at the edge or periphery of the package may be easiest to connect to on a second level package such as a circuit board. As the number of external connectors between a particular connector and an edge of the package increases, the difficulty of routing an electrical signal on the circuit board to that external connector may increase, because available paths for the signal to be routed to the edge of the package may be used by connections to the external connectors closer to the edge of the package. Conventional techniques may be used to add additional paths, for example by adding routing layers to the circuit board, using blind vias and/or other conventional techniques to access these internal connections. However, in large arrays, these techniques may increase the parasitic delay of the signals and/or increase the complexity and/or cost of the circuit board design. These costs may force circuit package and board designers to attempt to push parasitic and/or speed-sensitive signals to the edge of the microelectronic-package. Unfortunately, however, there may be a limited number of easily accessible external connectors on a package. Moreover, increasing the package size to provide more of these external connectors may add to the parasitics of the electrical connections in the package itself.

In contrast, some embodiments of the present invention can make the interior rows or columns of external connectors more accessible. This can reduce the above-described potential costs of traditional techniques for routing signals to interior rows or columns of external connectors.

Routing channels according to some embodiments of the present invention can be created to provide additional paths for signals from the edge (periphery) to the interior of the grid array microelectronic package. A routing channel can be any shape through which signals can be routed, which extends from the outside edge or periphery of the microelectronic package to its interior. In some embodiments, as was shown in FIGS. 1A, 3, 4 and 5, routing channels may be formed by removing external connectors from a first substrate, such as an integrated circuit, and their landing or mating sites on a second substrate such as a circuit board, which can free up signal routing layers on the circuit board for use in the routing channel.

In other embodiments, the external connectors on the integrated circuit in the defined routing channel can be retained but their electrical specification can be defined so that on the circuit board they are either no-connects (FIG. 1C) or are signals that can be electrically strapped together (FIG. 1B). For example, the external connectors in the routing channel can be electrically strapped together on the top layer of the circuit board without the need for vias in the routing channel to other conducting layers in the circuit board. In these embodiments, since the top layer of the circuit board may be used for the strap connection, such as strap connection 140, the available routing layers in the routing channel 130' may be reduced by one compared to absence of the external connectors or no-connect external connectors.

Some embodiments of the present invention can allow the number of signal routing layers in the circuit board to be reduced. Parasitics of the signal traces on the circuit board also may be reduced as trace congestion is reduced. Smaller packages may be used because fast signals can be placed in the interior of the package. The potential benefits of flip chip design may be more fully realized as high speed connectors can be placed as close as possible to their corresponding circuits in the integrated circuit, which may reduce the package parasitics. In other embodiments, the complexity of both the package and circuit board designs may be reduced.

Moreover, if the electrically strapped external connectors of embodiments of, for example, FIG. 1B, are used and these external connectors are power supply external connectors, supply decoupling capacitors may be placed closed to these external connectors on the outer layer of the circuit board. Accordingly, some embodiments of the present invention can improve and in some embodiments optimize, the total board, package and integrated circuit parasitic loads for electrical signals. It will be recognized, however, that embodiments of the present invention may remove some external connectors and/or cause their electrical specification to be defined as was described above, to allow for the provision of the routing channel.

Accordingly, if excess electrical connectors are available on the substrate and/or external connectors with defined electrical specifications are available, the routing channels may be formed and used to route electrical signals to external connectors in the interior of the package. Embodiments of the present invention may be particularly suitable for large grid arrays which may carry large numbers of high speed signals.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A grid array microelectronic package comprising:
a substrate;
an array of external connectors on the substrate that are arranged in at least four rows and at least four columns, including a pair of peripheral rows and a pair of peripheral columns at a periphery thereof and at least one pair of interior rows and at least one pair of interior columns between the respective pair of peripheral rows and peripheral columns, wherein at least one external connector in a peripheral row or peripheral column and at least one external connector in an interior row or interior column adjacent thereto are missing from the array to define a routing channel that extends from the periphery of the array towards the interior of the array; and a plurality of signal conductors that extend from outside the array of external connectors, along the routing channel, and electrically connect to a plurality of the external connectors in an interior row or interior column adjacent the routing channel.

2. A package according to claim 1 wherein a first external connector in a peripheral row or peripheral column, a second external connector in a first interior row or first interior column adjacent the peripheral row or peripheral column and a third external connector in a third interior row or third interior column adjacent the first interior row or first interior column and remote from the peripheral row or peripheral column are missing from the array to define the routing channel that extends from the periphery of the array towards the interior of the array.

3. A package according to claim 1 wherein the array of external connectors comprises an array of pads, pins, balls and/or bumps and wherein the substrate comprises an integrated circuit, a ceramic substrate, a plastic substrate and/or a printed circuit board.

4. A package according to claim 1 wherein the substrate is a first substrate and wherein the array of external connectors is a first array of external connectors, the package further comprising:
a second substrate; and
a second array of external connectors on the second substrate that are arranged to mate with the first array of external connectors.

5. A package according to claim 4 wherein the second array of external connectors comprises an array of pads, pins, balls and/or bumps and wherein the second substrate comprises an integrated circuit, a ceramic substrate, a plastic substrate and/or a printed circuit board.

6. A grid array microelectronic package comprising:
a substrate;
an array of external connectors on the substrate that are arranged in at least four rows and at least four columns, including a pair of peripheral rows and a pair of peripheral columns at a periphery thereof and at least one pair of interior rows and at least one pair of interior columns between the respective pair of peripheral rows and peripheral columns, wherein at least one external connector in a peripheral row or peripheral column and at least one external connector in an interior row or interior column adjacent thereto are electrically strapped together to define a routing channel that extends from the periphery of the array towards the interior of the array; and
a plurality of signal conductors that extend from outside the array of external connectors along the routing channel, and electrically connect to a plurality of the external connectors in an interior row or interior column adjacent the routing channel.

7. A package according to claim 6 wherein a first external connector in a peripheral row or peripheral column, a second external connector in a first interior row or first interior column adjacent the peripheral row or peripheral column and a third external connector in a third interior row or third interior column adjacent the first interior row or first interior column and remote from the peripheral row or peripheral column are electrically strapped together to define the routing channel that extends from the periphery of the array towards the interior of the array.

8. A package according to claim 6 wherein the array of external connectors comprises an array of pads, pins, balls and/or bumps and wherein the substrate comprises an integrated circuit, a ceramic substrate, a plastic substrate and/or a printed circuit board.

9. A package according to claim 6 wherein the substrate is a first substrate and wherein the array of external connectors is a first array of external connectors, the package further comprising:
a second substrate; and
a second array of external connectors on the second substrate that are arranged to mate with the first array of external connectors.

10. A package according to claim 9 wherein the second array of external connectors comprises an array of pads, pins, balls and/or bumps and wherein the second substrate comprises an integrated circuit, a ceramic substrate, a plastic substrate and/or a printed circuit board.

11. A grid array microelectronic package comprising:
a substrate;
an array of external connectors on the substrate that are arranged in at least four rows and at least four columns, including a pair of peripheral rows and a pair of peripheral columns at a periphery thereof and at least one pair of interior rows and at least one pair of interior columns between the respective pair of peripheral rows and peripheral columns, wherein at least one external connector in a peripheral row or peripheral column and at least one external connector in an interior row or interior column adjacent thereto are operationally disconnected from the substrate to define a routing channel that extends from the periphery of the array towards the interior of the array; and
a plurality of signal conductors that extend from outside the array of external connectors, along the routing channel, and electrically connect to a plurality of the external connectors in an interior row or interior column adjacent the routing channel.

12. A package according to claim 11 wherein a first external connector in a peripheral row or peripheral column, a second external connector in a first interior row or first interior column adjacent the peripheral row or peripheral column and a third external connector in a third interior row or third interior column adjacent the first interior row or first interior column and remote from the peripheral row or peripheral column are operationally disconnected from the substrate to define the routing channel that extends from the periphery of the array towards the interior of the array.

13. A package according to claim 11 wherein the array of external connectors comprises an array of pads, pins, balls and/or bumps and wherein the substrate comprises an integrated circuit, a ceramic substrate, a plastic substrate and/or a printed circuit board.

14. A package according to claim 11 wherein the substrate is a first substrate and wherein the array of external connectors is a first array of external connectors, the package further comprising:
a second substrate; and
a second array of external connectors on the second substrate that are arranged to mate with the first array of external connectors.

15. A package according to claim 14 wherein the second array of external connectors comprises an array of pads, pins, balls and/or bumps and wherein the second substrate comprises an integrated circuit, a ceramic substrate, a plastic substrate and/or a printed circuit board.

* * * * *